United States Patent [19]

Higgins, Jr.

[11] Patent Number: 4,533,885
[45] Date of Patent: Aug. 6, 1985

[54] APPARATUS FOR SUPPRESSION OF SPURIOUS ATTENUATION POLES IN CRYSTAL FILTERS

[75] Inventor: Robert J. Higgins, Jr., Sunrise, Fla.

[73] Assignee: Motorola, Inc., Schaumburg, Ill.

[21] Appl. No.: 488,874

[22] Filed: Apr. 27, 1983

[51] Int. Cl.$^3$ .................. H03H 9/56; H03H 9/58; H03H 9/05

[52] U.S. Cl. .................. 333/191; 333/189; 310/366

[58] Field of Search .................. 333/187–192; 310/311, 320–323, 334, 348, 365, 366, 351–356, 368

[56] References Cited

U.S. PATENT DOCUMENTS

| | | | |
|---|---|---|---|
| 3,453,458 | 7/1969 | Curran et al. | 333/189 X |
| 3,609,601 | 9/1971 | Phillips et al. | 333/192 |
| 4,282,454 | 8/1981 | Wakat, Jr. et al. | 310/348 |
| 4,329,666 | 5/1982 | Arvanitis | 333/191 |
| 4,334,343 | 6/1982 | Wakat, Jr. et al. | 29/25.35 |
| 4,430,596 | 2/1984 | Shanley | 310/348 |

OTHER PUBLICATIONS

U.S. Ser. No. 408,409, Charles Shanley, filed 8/16/82.
U.S. Ser. No. 336,475, Higgins, filed 12/31/81.
Transactions on Microwave Theory and Techniques, vol. MTT-18, No. 12, "A Four-Cavity Elliptic Waveguide Filter", Albert E. Williams, Dec. 1970; pp. 1109–1114.

Primary Examiner—Marvin L. Nussbaum
Attorney, Agent, or Firm—Joseph T. Downey; Edward M. Roney; Donald B. Southard

[57] ABSTRACT

Piezoelectric filter includes a piezoelectric substrate having an upper and lower opposed major surfaces. A plurality of N coupled resonators where N is an integer greater than two exposed on the surface of the substrate. A plurality of mounting pedestals are utilized to couple the resonators to ground in a manner such that no two non-adjacent resonators are coupled to any one pedestal. This mounting scheme suppresses undesired spurious attenuation poles and improves the selectivity of the piezoelectric filter.

11 Claims, 10 Drawing Figures

APPARATUS FOR SUPPRESSION OF SPURIOUS ATTENUATION POLES IN CRYSTAL FILTERS

BACKGROUND OF THE INVENTION

1. Field of the Invention

This invention relates to an apparatus for suppression of spurious responses in crystal filters. More particularly, this invention relates to an apparatus for suppressing undesired attenuation poles in the frequency response characteristic curves for pedestal mounted crystal filters.

2. Background of the Invention

A known pedestal mounting arrangement for supporting a crystal 10 is shown in FIG. 1. A substantially similar crystal mounting arrangement is described and claimed in U.S. Pat. No. 4,282,454, entitled "Piezoelectric Crystal Mounting and Connection Arrangement", issued to Wakat, Jr. et al. on Aug. 4, 1981 and having the same assignee as the present invention. The contents of U.S. Pat. No. 4,282,454 are hereby incorporated by reference. U.S. Pat. No. 4,334,343 for a "Method of Making Crystal mounting and Connection Arrangement" issued to Wakat, Jr. et al. on June 15, 1982 also shares a common assignee with the present invention. The contents of U.S. Pat. No. 4,334,343 are hereby incorporated by reference. A U.S. Pat. application Ser. No. 408,409 to Charles Shanley, filed Aug. 16, 1982, now U.S. Pat. No. 4,430,596 issued Feb. 7, 1984, discloses and claims an improved pedestal mounting arrangement and is entitled "Temperature Insensitive Piezoelectric Crystal Mounting Arrangement". The contents of such U.S. Pat. No. 4,430,596 are hereby incorporated by reference.

Referring now to the cross-sectional view of FIG. 1 viewed in conjunction with FIG. 2A and FIG. 2B, crystal 10, which may be a polished AT cut quartz blank, includes opposed major surfaces, namely upper surface 15 and lower surface 20. Disposed on upper surface 15 is a plurality of electrically conductive upper surface electrodes 25, 30, 35 and 40. Located substantially opposite these upper surface electrodes are lower surface electrodes 45, 50, 55 and 60 respectively. These upper and lower surface electrodes may, for example, be made of aluminum and are situated in such a manner to form a crystal filter network wherein electrode pair 25 and 45 form a first resonator, electrode pair 30 and 50 form a second resonator, electrode pair 35 and 55 form a third resonator, and electrode pair 40 and 60 form a fourth resonator. In this arrangement, the first and second resonator are substantially adjacent and acoustically coupled together. Similarly, the second and third resonators are substantially adjacent and acoustically coupled together as are the third and fourth resonators. It will be appreciated by those skilled in the art that coupling, either electrical or acoustical is typically undesirable between nonadjacent resonators.

As shown in FIGS. 1 and 2A a wirebond pad 65 is coupled to electrode 25 by a narrow conductor 70. Wirebond pad 65 is connected by a fine bonding wire 75 to an external wirebond pad 80. This wirebond pad 80 may be used as the filter input and is connected to external circuitry as necessary to utilize the crystal filter.

In a like manner, wirebond pad 85 is electrically coupled to resonator 50 by a narrow conductor 90. Wirebond pad 85 is normally coupled by a fine bonding wire 95 to an external wirebond pad 100 which may be used as the filter output and is connected to other circuitry as necessary to utilize the filter. Similar narrow conductors 105 and 110 are shown clearly in FIG. 2A and are utilized to couple electrodes 30 and 35 to wirebond pads 115 and 120 respectively which are in turn coupled through wirebonds (not shown) to a circuit ground.

Turning now to FIG. 2B viewed in conjunction with FIG. 1, a pedestal mounting pad 130 is attached to a conductive mounting pedestal 135. As shown more clearly in FIG. 2B, pedestal mounting pad 130 is electrically coupled to each of electrodes 45, 50, 55 and 60 by narrow conductors 145, 150, 155 and 160 respectively. Pedestal 135 is in turn coupled electrically to electrical circuit ground in order to form a complete functioning crystal filter.

A schematic model of the resulting filter is shown in FIG. 3 wherein for simplicity the input terminal 200 is taken to be wirebond pad 65 and output terminal 205 is taken to be wirebond pad 85. In this simplified model the resonator formed by electrode pair 25 and 45 is modeled as a capacitor 210 in parallel with a series L-C circuit shown as capacitor 215 and inductor 220. The resonator formed by electrode pair 30 and 50 is modeled as capacitor 225 in parallel with the series L-C combination of capacitor 230 and inductor 235. Inductor 240 represents the inductance of the wirebond wire (not shown) coupling electrode 30 to ground. The resonator formed by electrode pair 35 and 55 is modeled by capacitor 245 in parallel with the series L-C circuit of capacitor 250 and inductor 255. Inductor 260 represents the inductance the bonding wire (not shown) coupling resonator electrode 35 to ground. The resonator formed by electrode pair 40 and 60 is modeled by capacitor 265 in parallel with the series L-C combination of capacitor 270 and inductor 275. For simplicity in the circuit, the internal resonator coupling has been represented by coupling co-efficients K1, K2, and K3. It will be evident to one skilled in the art that this acoustical coupling may be modeled schematically in many other ways, as for example by capacitive or magnetic coupling.

For the circuit of FIG. 3, capacitors 210, 225, 245, and 265 represent the parallel-plate capacitance of each individual resonator. This capacitance is formed by the sandwich-like structure of the resonator's upper and lower electrodes with crystal 10 serving as the dielectric. Capacitors 215, 230, 250, and 270 represent the motional capacitance of each respective resonator as is well known in the art. Inductors 220, 235, 255 and 275 represent the motional inductance of each individual resonator respectively as is well known in the art.

Inductor 280 represents the inductance of the mounting pedestal itself. The pedestal may be on the order of 0.04 to 0.06 millimeters in height and may have an inductance on the a nanohenries. Each of the resonators of the circuit of FIG. 3 is electrically coupled to node 290. This node represents the pedestal mounting pad 130. This node would ideally be coupled directly to ground, however, pedestal inductance 280 separates this node from ground and causes a finite amount of undesired coupling between non-adjacent resonators and particularly from the input resonator to the output resonator.

A frequency response plot of attenuation in dB vs relative frequency is shown in FIG. 4 for the circuit of FIG. 3. Curve 300 of that graph represents the frequency response of the circuit of FIG. 3. One skilled in the art will recognize that the crystal filter will have, for example, a small amount of insertion loss as a result of the finite Q of each of the individual resonators making up the filter. For sake of simplicy of the model, these resistive effects have not been taken into consideration. Therefore, although the plot of FIG. 4 (and subsequently FIG. 8) does not reflect the insertion loss, slight bandwidth change, etc, which will result from the finite Q of the crystal's resonators, it provides a sound basis for comparison for purposes of the present discussion.

In FIG. 4 curve 300 is seen to exhibit a pair of attenuation poles evidenced by dips in curve 300 at points generating designated 310 and 320. The exact location of these dips is somewhat difficult to control due to variations in processing, etc. These are undesirable attenuation poles and severely limit the ultimate selectivity (far-out stop band rejection) on both the high side and the low side of the crystal filter's response. In addition, due to the unpredictable nature of exactly where in frequency these poles will actually occur, they can and frequently do have the detrimental effect of altering the bandwidth of the filter response. These undesired poles are the direct result of parasitic pedestal inductance 280 which electrically couples non-adjacent resonators. The need to eliminate these undesired filter responses will be readily apparent to one skilled in the art.

SUMMARY OF THE INVENTION

It is an object of the present invention to provide an improved crystal filter structure.

It is another object of the present invention to provide an improved pedestal mounting scheme for a crystal filter which suppresses spurious attenuation poles caused by the pedestal.

It is a further object of the present invention to provide a crystal filter with improved ultimate selectivity and predictable band pass characteristics.

These and other objects of the invention will become apparent to those skilled in the art upon consideration of the following description of the invention.

In one embodiment of the present invention a crystal filter includes a substrate having upper and lower opposed major surfaces. A plurality of N coupled resonators, where N is an integer greater than two, are disposed on the surfaces of the substrate and each includes a lower electrode disposed on the lower surface of said substrate. A plurality of at least the largest integer not exceeding $(N+1)/2$ mounting pedestals is each electrically coupled to certain of the lower electrodes so that no two nonadjacent lower electrodes are coupled to a common pedestal.

The features of the invention believed to be novel are set forth with particularity in the appended claims. The invention itself however, both as to organization and method of operation, together with further advantages and objects thereof, may be best understood by reference to the following description taken in conjunction with the accompanying drawings.

DESCRIPTION OF THE PREFERRED EMBODIMENT

Figure 5:
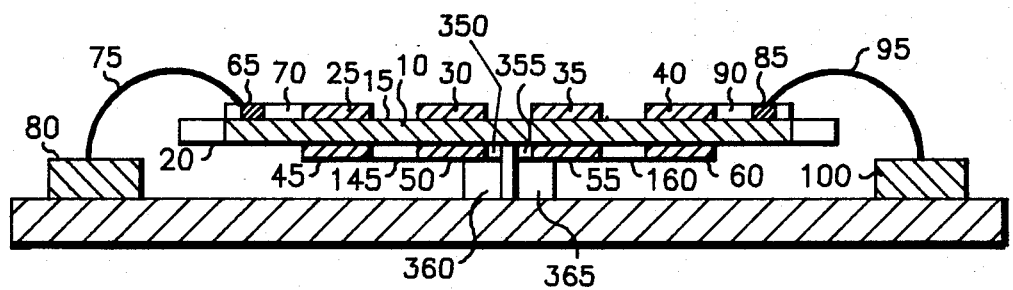
FIG. 5 is a cross-sectional view of the pedestal mounted crystal filter of the present invention taken along line 5—5 of FIG. 6A.
Figure 6A:
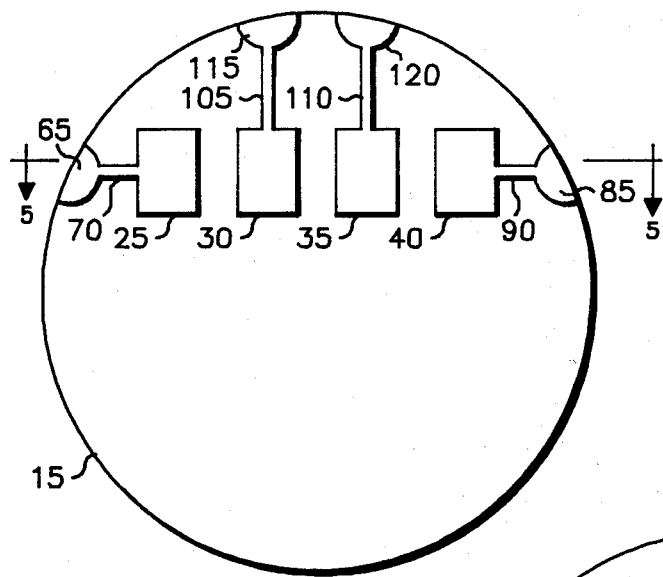
FIG. 6A is a plan view of the lower surface of the crystal filter of the present invention as viewed from below.
Figure 6B:
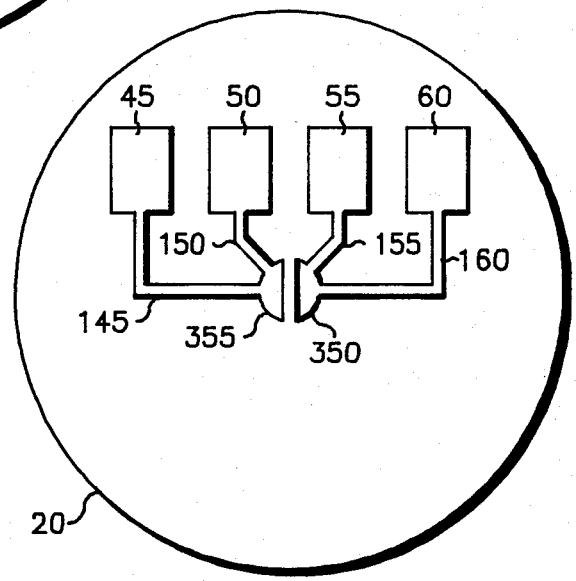
FIG. 6B is a plan view of the upper surface of the crystal filter of the present invention as viewed from above.

Referring now to FIG. 5, taken in conjunction with FIGS. 6A and 6B, a preferred embodiment of the present invention is shown. Upper surface 15 of crystal 10 is substantially similar to that of the more conventional pedestal mounted crystal filter. Lower surface 20 however, is substantially different in that pedestal mounting pad 130 has now been divided into two separate pedestal mounting pads 350 and 355. Lower surface electrodes 55 and 60 are now electrically coupled to narrow conductors 155 and 160 to pedestal mounting pad 350, while lower surface electrodes 45 and 50 are electrically coupled to narrow conductors 145 and 150 to pedestal mounting pad 355. In this manner, no two non-adjacent electrodes are coupled to the same pedestal mounting pad. These pedestal mounting pads 350 and 355 are in turn mounted to conductive pedestals 360 and 365B respectively. Pedestal mounting pads 350 and 355 may be connected to pedestals 360 and 365 by, for example, conductive epoxy.

Figure 1:
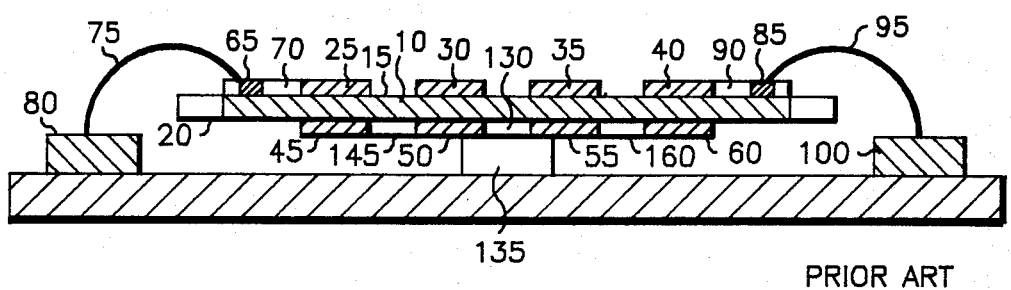
FIG. 1 is a cross-sectional view of a pedestal mounted crystal filter taken along line 1—1 of FIG. 2A.
Figure 2A:
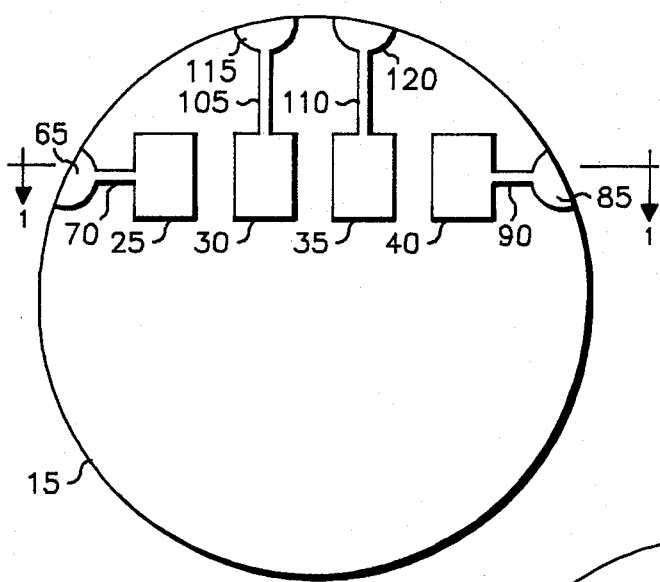
FIG. 2A is a plan view of the upper surface of the crystal filter of FIG. 1 as viewed from above.
Figure 2B:
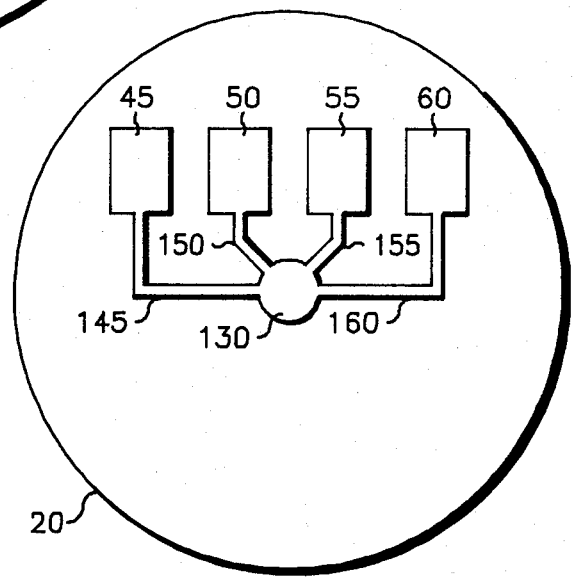
FIG. 2B is a plan view of the lower surface of the crystal filter of FIG. 1 as viewed from below.
Figure 3:
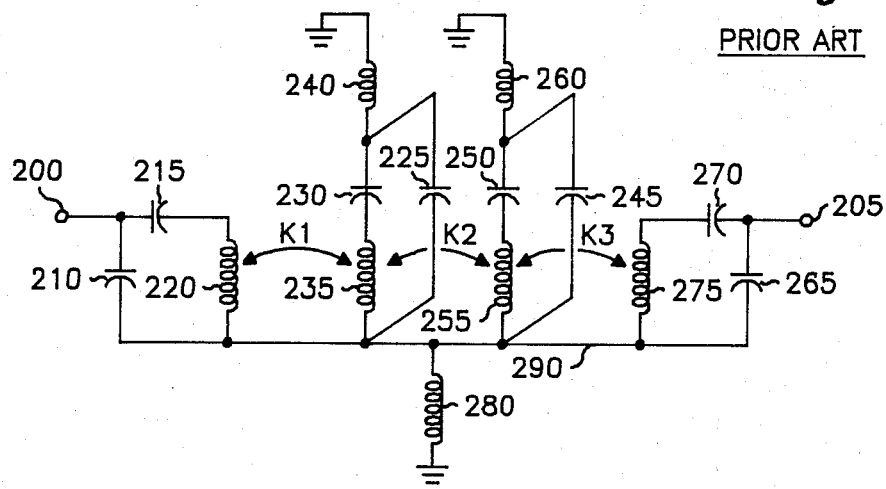
FIG. 3 is a schematic model of the crystal filter shown in FIG. 1.
Figure 7:
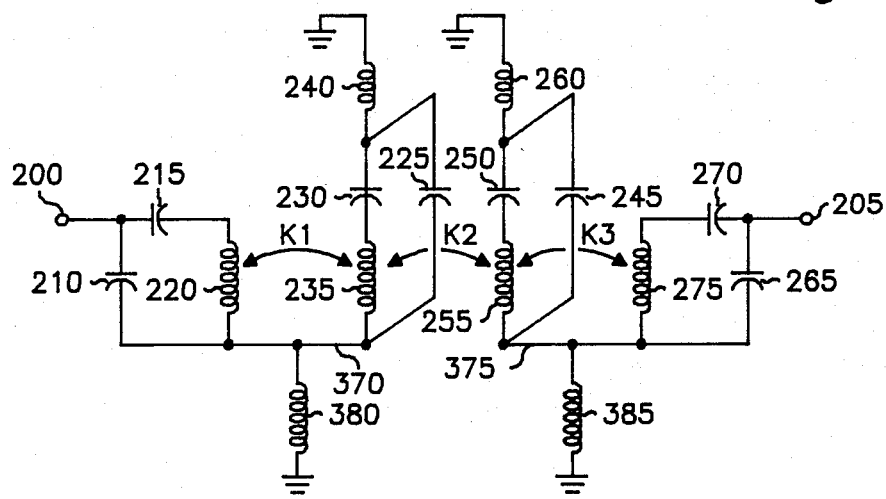
FIG. 7 is a schematic model of the crystal filter of the present invention.

Referring now to FIG. 7 a circuit model for the present invention is shown. This model is substantially similar in many respects to that of FIG. 3. The changes resulting from dividing the pedestal and the pedestal mounting pads into two parts include the changing of node 290 to two separate nodes 370 and 375, the separation occuring between the second and third resonator. The stray pedestal inductance 280, which was common to both input and output in the filter as shown in FIG. 3 is now divided into two inductances 380 and 385. Inductance 380 is connected from node 370 to ground while inductance 385 is connected from node 375 to ground. The effect of moving these inductances is elimination of any common electrical coupling between non-adjacent resonators caused by the pedestal inductance. This in effect divides the circuit of FIG. 7 into two distinct parts wherein the only coupling presented between non-adjacent resonators is caused by K2 which is the desired coupling. This desired coupling K2 is readily controllable by resonator spacing, etc. and therefore the filter parameters of the present invention much more closely approximate an ideal filter.

Figure 4:
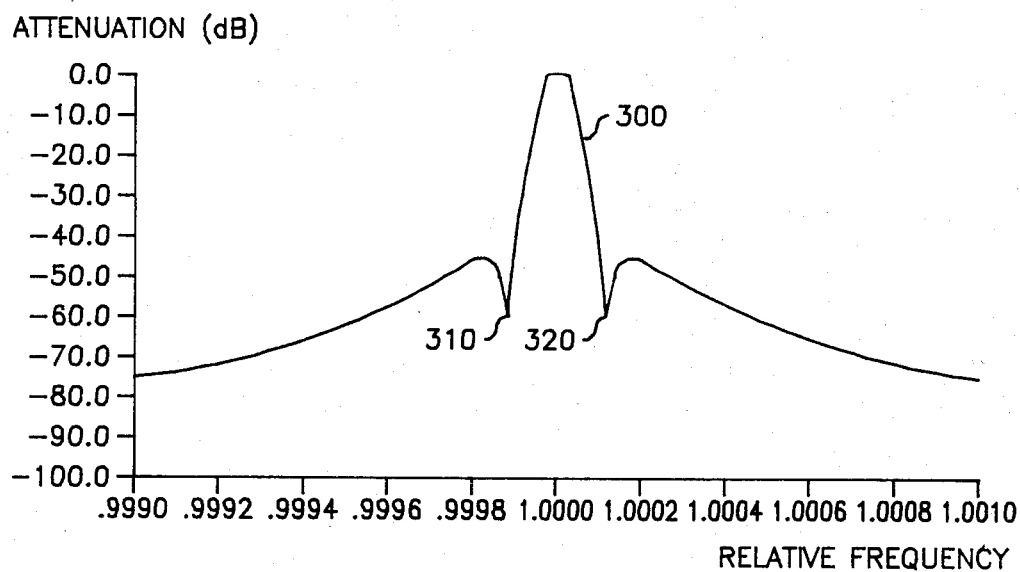
FIG. 4 is a plot of the frequency response in attenuation vs relative frequency of the crystal filter of FIG. 1.
Figure 8:
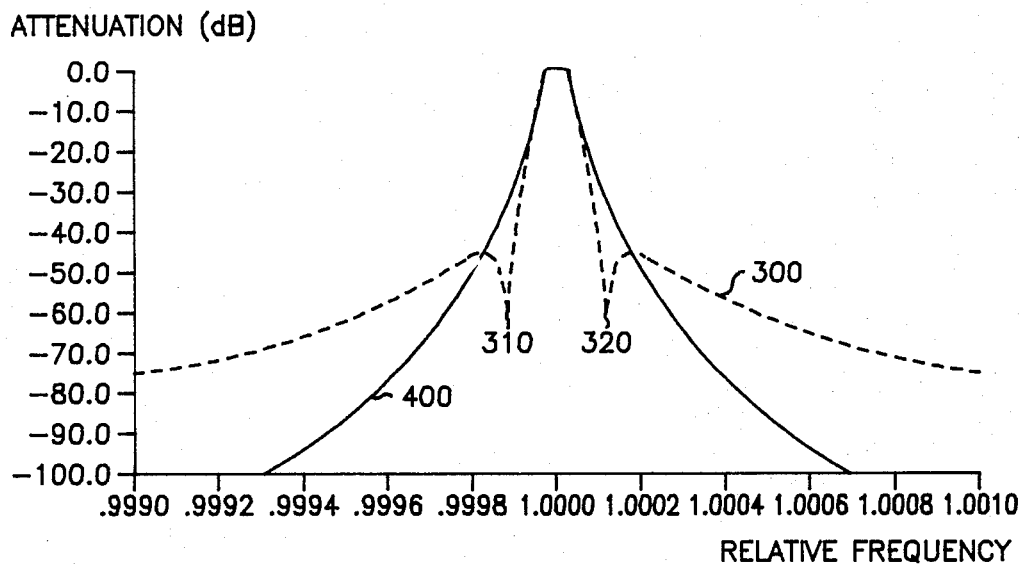
FIG. 8 shows a frequency response plot of the crystal filter of the present invention on the same graph with the frequency response plot of the crystal filter of FIG. 1.

Referring now to FIG. 8 the dramatic results of this change can be clearly seen. FIG. 8 is a plot of attenuation in dB vs relative frequency for the crystal filter of the present invention. Curve 400 of this plot represents the frequency response of the present filter. Curve 300 of FIG. 4 is shown in broken lines on the same graph for ease of comparison. It is evident from this plot that separation of pedestal mounting pad 130 into two pedestal mounting pads 350 and 355 and separation of the pedestal 135 into two pedestals 360 and 365 has eliminated the presence of spurious responses 310 and 320 of Curve 300. Also evident from this plot is the dramatic increase in selectively (attenuation) outside the passband resulting from the present invention. For example, at relative frequency 0.9996 an improvement in attenuation of over 20 dB is realized.

Although the preferred embodiment of the present invention shows a four-pole (four resonator) crystal filter, it is evident that the present invention is applicable to any piezoelectric filter having at least three resonators. For a generalized crystal filter having N resonators, a total of at least INT((N+1)/2) pedestals are required, where the function INT(X) represents the greatest integer which does not exceed X (sometimes called the truncated integer function). For example, a six resonator crystal filter would require INT((6+1)/2)=3 pedestals minimum. More pedestals could of course be utilized without detrimental effect. In this example, the first and second resonators can be coupled to a first pedestal, the third and fourth resonator can be coupled to a second pedestal, and the fifth and six resonators can be coupled to a third pedestal. In this manner no two non-adjacent resonators are coupled to the same pedestal and therefore no two non-adjacent resonators are subject to the electrical coupling caused by the pedestal inductance. All even order filters can be divided into pairs of two in a manner similar to this example in one embodiment of the present invention.

By way of a second example, consider a seventh order filter. A seventh order filter requires a total of INT((7+1)/2)=4 pedestals. In this example, the first and second resonators may be coupled to a first pedestal, the third and fourth resonator may be coupled to a second pedestal, the fifth and sixth resonators may be coupled to a third pedestal, and the seventh resonator may be coupled to a fourth pedestal according to one embodiment of the present invention. Other variations may of course be utilized for odd order filters which still utilize a minimum number of pedestals. The important consideration, however, remains the same for either odd or even order filters; namely that no two non-adjacent resonators which by design are not intended to be electrically coupled together should be electrically connected to and grounded through a common pedestal.

It should also be noted that in some cases some, but not all, of the parasitic attenuation poles may actually be desirable if they can be controlled. In these instances, some of the non-adjacent resonators may be allowed to electrically couple through the pedestal while others which are undesirable may be eliminated by the present technique. The undesired coupling may be isolated by experimentation or computer simulation.

Thus it is apparent that in accordance with the present invention an apparatus that fully satisfies the objects, aims and advantages is set forth above. While the invention has been described in conjunction with the several specific embodiments, it is evident to those skilled in the art that many alternatives, modifications, and variations will be apparent in light of the foregoing description. Accordingly it is intended that the present invention embrace all such alternatives, modifications, permutations and variations as fall within the spirit and broad scope of the appended claims.

What is claimed is:

1. A piezoelectric filter, comprising:
   a piezoelectric substrate including upper and lower opposed major surfaces;
   a plurality of N electrically cascaded resonators disposed on said piezoelectric substrate where N is an integer greater than two, each of said resonators including a lower electrode disposed on said lower major surface and each resonator in said cascade along with its corresponding electrodes being assigned a consecutive ordinal integer such that adjacent resonators and their associated adjacent lower electrodes are assigned numbers differing by one; and
   a plurality of at least INT (N+1)/2 mounting pedestals each electrically coupled to certain of said lower electrodes so that a maximum of two adjacent lower electrodes are coupled to any of said pedestals, at least one pair of two adjacent lower electrodes are connected to one of said pedestals.

2. The piezoelectric filter of claim 1, wherein said piezoelectric substrate is composed substantially of quartz.

3. The piezoelectric filter of claim 2, wherein said mounting pedestals each include a lower end and each of said lower ends is electrically coupled to ground.

4. The piezoelectric filter of claim 3, wherein N equals 4.

5. A piezoelectric filter, comprising:
   a piezoelectric substrate including upper and lower opposed major surfaces;
   a plurality of at least three resonators disposed on said major surfaces in an electrical cascade arrangement and said plurality of resonators including adjacent resonators wherein a pair of resonators are adjacent resonators wherein a pair of resonators are adjacent resonaators if said resonators are consecutive in said electrical cascade; and
   means for grounding said resonators such that each resonator is grounded and only adjacent pairs of resonators share a common path a ground.

6. The piezoelectric filter of claim 5 wherein said piezoelectric substrate is composed substantially of quartz.

7. The piezoelectric filter of claim 6 wherein said grounding means includes a plurality of mouting pedestals coupled to a plurality of pedestal mounting pads.

8. The piezoelectric filter of claim 7, wherein only adjacent resonators are coupled to a single pedestal mounting pad.

9. A piezoelectric filter, comprising:
   a piezoelectric substrate inclduing upper and lower opposed major surfaces;
   a plurality of at least three resonators in an electrical cascade arrangement disposed on said major surfaces; and
   meand for grounding each of said resonators so that at least two of said resonators which are not consecutive resonators in said lectrical cascade arrangement utilize different paths from said substrate to a ground node external to said substrate.

10. The piezoelectric filter of claim 9, wherein said grounding means includes a plurality of mounting pedestals coupled to a plurality of pedestal mounting pads.

11. A piezoelectric filter, comprising:
   a piezoelectric substrate including upper and lower opposed major surfaces;
   a plurality of at least three resonators disposed on said surfaces, each of said resonators having a lower electrode disposed on said lower surface; and
   a plurality of mounting pedestals each having a first and a second end and each of which is electrically coupled together to an electrical node at said first end and coupled to at least one of said lower electrodes at said second end, so that said lower electrodes are coupled together at said electrical node through said plurality of mounting pedestals.

* * * * *

UNITED STATES PATENT AND TRADEMARK OFFICE
CERTIFICATE OF CORRECTION

PATENT NO. : 4,533,885
DATED : Aug. 6, 1985
INVENTOR(S) : Robert J. Higgins, Jr.

It is certified that error appears in the above-identified patent and that said Letters Patent is hereby corrected as shown below:

In claim 5, column 6, line 28, delete "wherein a pair of resonators are".

In claim 5, column 6, line 29, delete "adjacent resonaators".

In claim 5, column 6, line 33, delete "a" and substitute --to--. (2nd occurrence).

In claim 9, column 6, line 43, delete "inclduing" and substitute --including--.

In claim 9, column 6, line 48, delete "meand" and substitute --means--.

In claim 9, column 6, line 50, delete "lectrical" and substitute --electrical--.

Signed and Sealed this

Twenty-seventh Day of January, 1987

Attest:

DONALD J. QUIGG

Attesting Officer

Commissioner of Patents and Trademarks